(12) United States Patent
Liaw

(10) Patent No.: US 11,935,882 B2
(45) Date of Patent: Mar. 19, 2024

(54) STATIC RANDOM ACCESS MEMORY DEVICE

(71) Applicant: TAIWAN SEMICONDUCTOR MANUFACTURING COMPANY, LTD., Hsinchu (TW)

(72) Inventor: Jhon Jhy Liaw, Zhudong Township (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 277 days.

(21) Appl. No.: 17/403,788

(22) Filed: Aug. 16, 2021

(65) Prior Publication Data

US 2021/0375854 A1 Dec. 2, 2021

Related U.S. Application Data

(63) Continuation of application No. 15/787,192, filed on Oct. 18, 2017, now Pat. No. 11,094,685.
(Continued)

(51) Int. Cl.
*H01L 27/02* (2006.01)
*G11C 11/412* (2006.01)
(Continued)

(52) U.S. Cl.
CPC ........ *H01L 27/0207* (2013.01); *G11C 11/412* (2013.01); *H01L 23/5226* (2013.01);
(Continued)

(58) Field of Classification Search
None
See application file for complete search history.

(56) References Cited

U.S. PATENT DOCUMENTS 7,990,760 B2   8/2011  Fukano
8,661,389 B2 * 2/2014  Chern .................. G06F 30/392
                                              716/110
(Continued)

FOREIGN PATENT DOCUMENTS

JP   2014029903     2/2014
JP   2014029903 A   2/2014

OTHER PUBLICATIONS

Non-Final Office Action issued in U.S. Appl. No. 15/787,192, dated Apr. 13, 2020.
(Continued)

*Primary Examiner* — Michelle Mandala
*Assistant Examiner* — Jordan M Klein
(74) *Attorney, Agent, or Firm* — STUDEBAKER & BRACKETT PC

(57) ABSTRACT

A semiconductor device including a static random access memory (SRAM) device includes a first SRAM array including a first plurality of bit cells arranged in a matrix; a second SRAM array including a second plurality of bit cells arranged in a matrix; and a plurality of abutting dummy cells disposed between the first SRAM array and the second SRAM array. Each of the plurality of abutting dummy cells includes a plurality of dummy gate electrode layers and a plurality of dummy contacts. The semiconductor device further includes a first-type well continuously extending from the first SRAM array to the second SRAM array. The first-type well is in direct contact with portions of the plurality of dummy contacts.

20 Claims, 12 Drawing Sheets

Related U.S. Application Data

(60) Provisional application No. 62/427,715, filed on Nov. 29, 2016.

(51) Int. Cl.
   *H01L 23/522* (2006.01)
   *H01L 23/528* (2006.01)
   *H10B 10/00* (2023.01)

(52) U.S. Cl.
   CPC .......... *H01L 23/528* (2013.01); *H10B 10/12* (2023.02); *H10B 10/18* (2023.02)

(56) References Cited

U.S. PATENT DOCUMENTS

| | | | |
|---|---|---|---|
| 2005/0018474 A1 | 1/2005 | Sohn | |
| 2007/0200182 A1* | 8/2007 | Liaw | H10B 10/12 257/E27.099 |
| 2009/0003027 A1 | 1/2009 | Inage et al. | |
| 2009/0285039 A1 | 11/2009 | Adams et al. | |
| 2010/0193877 A1 | 8/2010 | Liaw | |
| 2013/0154027 A1* | 6/2013 | Liaw | H10B 10/12 257/E27.06 |
| 2013/0320458 A1* | 12/2013 | Deng | G11C 11/412 257/390 |
| 2014/0153321 A1* | 6/2014 | Liaw | G11C 11/413 365/154 |
| 2015/0170734 A1 | 6/2015 | Hwang et al. | |
| 2016/0240540 A1* | 8/2016 | Hung | H01L 21/845 |

OTHER PUBLICATIONS

Final Office Action issued in U.S. Appl. No. 15/787,192, dated Oct. 19, 2020.

Notice of Allowance issued in U.S. Appl. No. 15/787,192, dated Mar. 3, 2021.

* cited by examiner

STATIC RANDOM ACCESS MEMORY DEVICE

CROSS REFERENCE TO RELATED APPLICATION

This application is a continuation of U.S. application Ser. No. 15/787,192, filed Oct. 18, 2017, now U.S. Pat. No. 11,094,685, which claims priority to U.S. Provisional Application No. 62/427,715, filed Nov. 29, 2016, entitled "STATIC RANDOM ACCESS MEMORY DEVICE," the entire disclosures of each of which are incorporated herein by reference.

TECHNICAL FIELD

The present disclosure is related to a semiconductor device, more particularly, to a static random access memory (SRAM) device.

BACKGROUND

An SRAM array (or macro) usually uses edge/strap cells surrounding an array of bit cells which store data, such that the outmost bit cells of the SRAM array can have a similar environment as the inner bit cells thereof, thereby creating a more uniform operation of the bit cells regardless of the positions of the bit cells in the SRAM array, as compared to an SRAM array without edge/strap cells. SRAM arrays forming a memory device usually require keep-out regions between adjacent SRAM arrays to separate the adjacent SRAM arrays from each other for integration purpose. The keep-out regions can also be used for design-rule check purpose. If no keep-out region is formed or a keep-out region is insufficiently formed between two immediately adjacent SRAM arrays, the SRAM arrays can have design rule violation or process margin issue. On the other hand, if the keep-out regions occupy a relatively large area, the keep-out regions may consume a significant portion of the entire space available to manufacture a memory device and thus will limit scaling capability.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
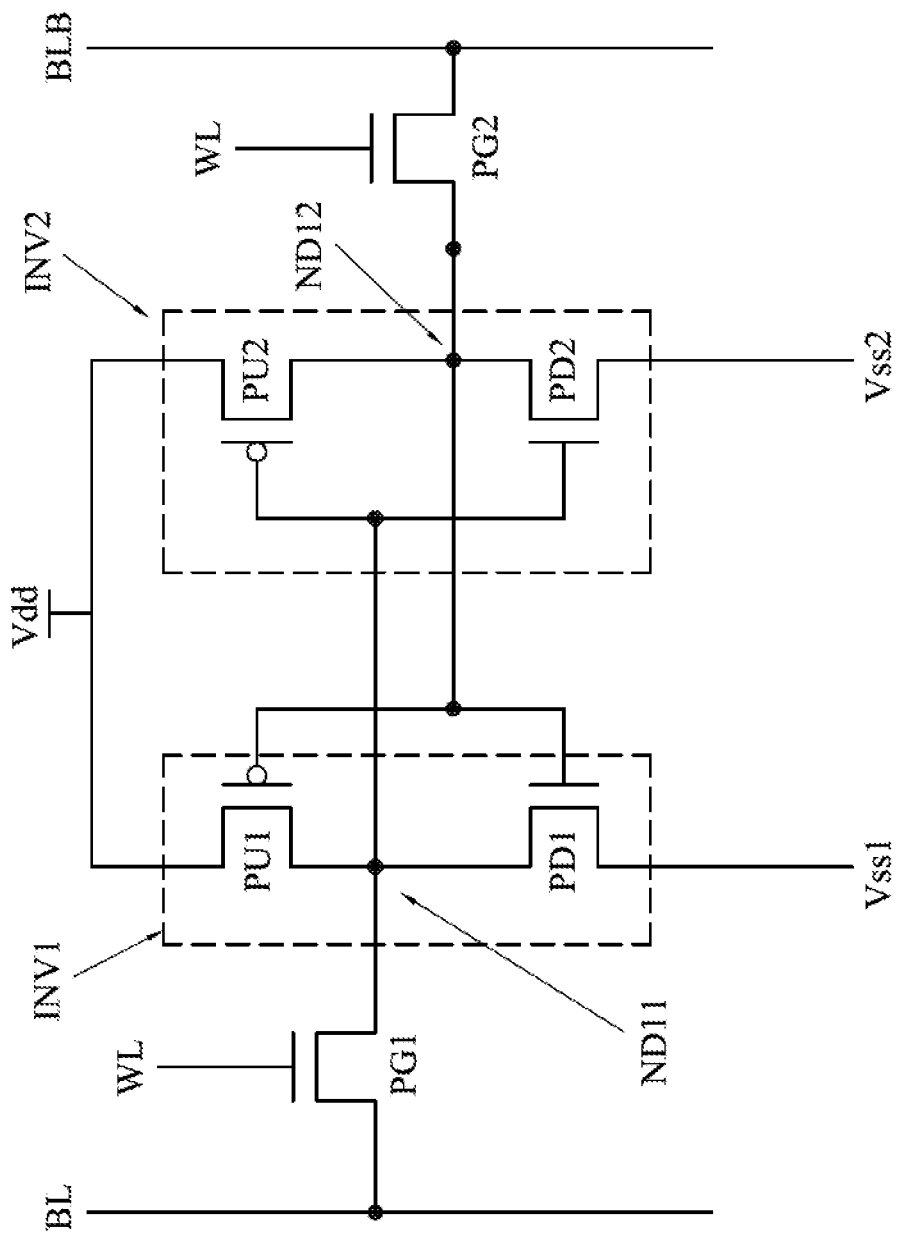
FIG. 1 illustrates an exemplary circuit diagram of a static random access memory (SRAM).

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The device may be otherwise oriented (rotated 90 degrees or at other orientations) and the spatially relative descriptors used herein may likewise be interpreted accordingly.

In the present disclosure, a layer, a pattern, a line such as a bit line, a word line, and a power line, or a structure extending in one direction means that a dimension of the layer, the pattern, the line, or the structure in the extended one direction is greater than another dimension thereof in another direction perpendicular to the extended one direction, with, or without, consideration of process errors/variations occurred during manufacturing. In the present disclosure, unless described explicitly, extending a layer, a pattern, a line, or a structure means unidirectionally extending a layer, a pattern, a line (including a bit line or a word line), with, or without, consideration of process errors/variations in manufacturing. That is, unless described explicitly, extending a layer, a pattern, a line, or a structure means forming a layer, a pattern, a line, or a structure having the same width with, or without, consideration of process errors/variations. It should be understood that in the present disclosure, one pattern (or one direction) being perpendicular or substantially perpendicular to another pattern (or another direction) means that the two patterns (or two directions) are perpendicular to each other or the two patterns (or two directions) are perpendicular to each other with, or without, consideration of errors/variations in manufacturing process. It should be understood that in the present disclosure, one pattern (or one direction) being parallel or substantially parallel to another pattern (or another direction) means that the two patterns (or two directions) are parallel to each other or the two patterns (or two directions)

are parallel to each other with, or without, consideration of margins or errors/variations in manufacturing process.

In the present disclosure, it should be appreciated that a respective layer of a memory cell that touches or crosses a boundary thereof is continuously formed when another memory cell is disposed immediately adjacent to the memory cell along the common boundary thereof. In other words, the respective layer of the memory cell and another layer of the adjacent memory cell corresponding to the respective layer form a single continuous layer.

FIG. 1 illustrates an exemplary circuit diagram of a static random access memory (SRAM) cell 10. The SRAM cell 10 includes cross-coupled first and second inverters INV1 and INV2, and first and second pass-gate transistors PG1 and PG2. Source electrodes of the pass-gate transistors PG1 and PG2 are respectively coupled to a first bit line BL and a second bit line BLB carrying data complementary to that carried by the first bit line BL, and gate electrode layers of the pass-gate transistors PG1 and PG2 are coupled to a word line WL. A drain electrode of the first pass-gate transistor PG1, an output of the first inverter INV1, and an input of the second inverter INV2 are coupled to each other at a first local connection electrode ND11. A drain electrode of the second pass-gate transistor PG2, an input of the first invertor INV1, and an output of the second invertor INV2 are coupled to each other at a second local connection electrode ND12. The cross-coupled first and second inverters INV1 and INV2 function as a latch that stores a value and its complement. The cross-coupled invertors INV1 and INV2 are implemented by a first pull-up transistor PU1 and a first pull-down transistor PD1, and by a second pull-up transistor PU2 and a second pull-down transistor PD2, respectively. Drain electrodes of the first pull-up transistor PU1, the first pass-gate transistor PG1, and the first pull-down transistor PD1 are connected to each other at the first local connection electrode ND11. Drain electrodes of the second pull-up transistor PU2, the second pass-gate transistor PG2, and the second pull-down transistor PD2 are connected to each other at the second local connection electrode ND12.

Source electrodes of the first and second pull-down transistors PD1 and PD2 are connected to first and second power supply lines Vss1 and Vss2, respectively. The first and second power supply lines Vss1 and Vss2 can be directly connected to each other in the region of the SRAM cell 10, for example, by one or more metal layers formed on the first and second power supply lines Vss1 and Vss2, according to some embodiments. The first and second power supply lines Vss1 and Vss2 can be electrically isolated to each other in the region of the SRAM cell 10, but may be connected to each other in a region outside the SRAM cell 10 according to other embodiments.

Source electrodes of the first and second pull-up transistors PU1 and PU2 are connected to a power line Vdd.

Figure 2:
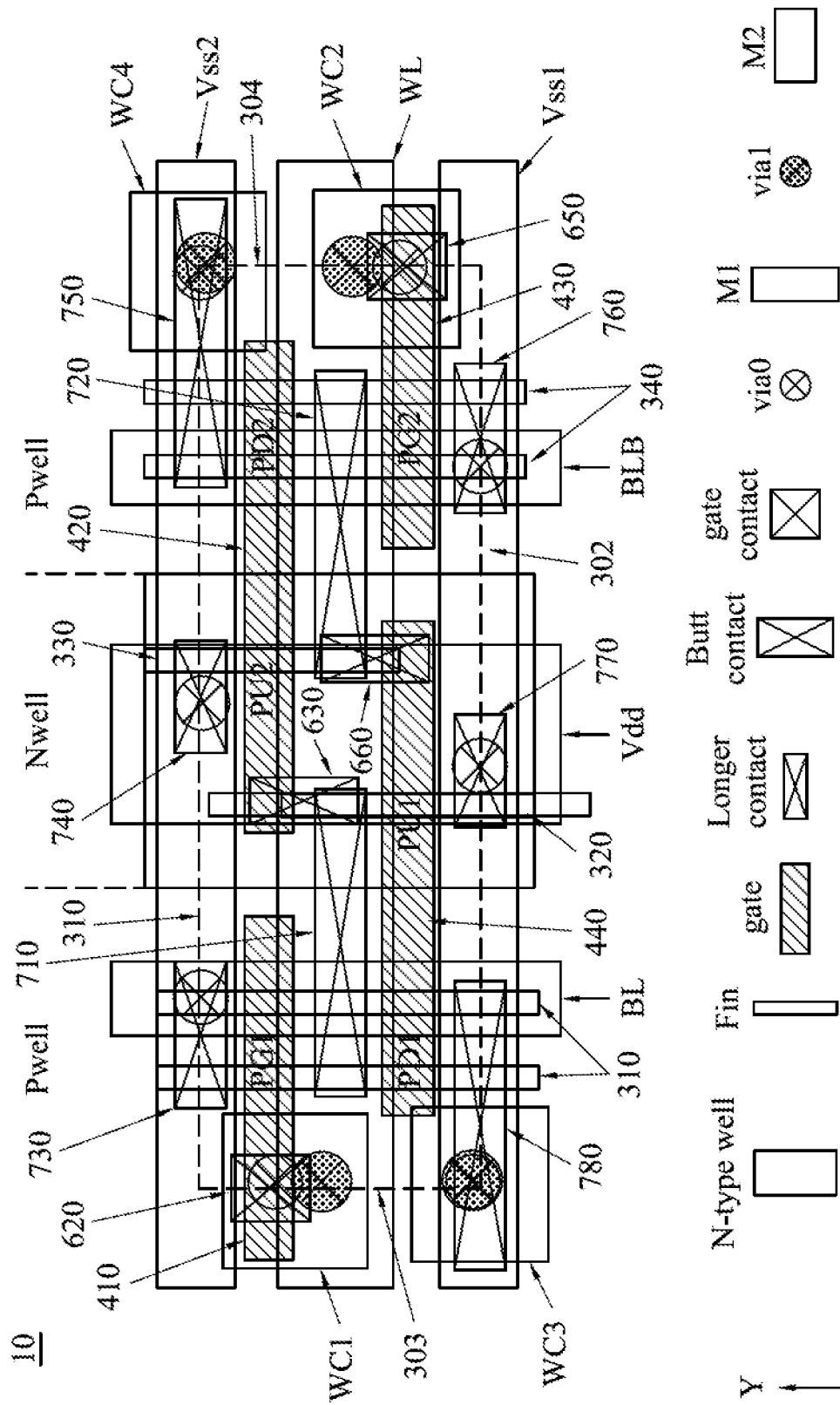
FIG. 2 illustrates an exemplary simplified layout of an SRAM cell, of which the circuit diagram is shown in FIG. 1

FIG. 2 illustrates an exemplary simplified layout of the SRAM cell 10, of which the circuit diagram is shown in FIG. 1. For convenience of illustration, an exemplary simplified layout shown in FIG. 2 only illustrates a layout of wells, semiconductor fins, gate electrode layers/gate electrodes, contacts formed on semiconductor fins, gate contacts formed on the gate electrode layers/gate electrodes, vias (via0 and vias1), a first metal layer M1, and a second metal layer M2. One of ordinary skill in the art should understand that one or more metal layers can be formed at a level above the second metal layer M2 and be electrically connected to conductive patterns therebelow through vias therebetween.

Referring to FIG. 2, the SRAM cell 10 is formed in a region defined by first and second boundaries 301 and 302 parallel to the X axis and third and fourth boundaries 303 and 304 parallel to the Y axis and connected between the first and second boundaries 301 and 302. In other words, the region (a unit cell) has a rectangular shape enclosed by the boundaries 301-304. The region defined by the first through fourth boundaries 301 through 304 includes three wells which are an N-type well Nwell located at a center thereof and first and second P-type wells Pwell located on opposite sides of the N-type well Nwell.

In FIG. 2, only the boundaries of the N-type well Nwell are marked. One having ordinary skill in the art should understand that the first and second P-type wells Pwell occupy the remaining portions of the SRAM cell 10.

In some embodiments, in a case in which a layer crosses one of boundaries of a cell or extends from one boundary to another boundary, the layer is symmetrically arranged with reference to the one boundary. In this FIG. 2 case, in an SRAM cell and another SRAM cell adjacent to the SRAM cell sharing the same boundary with the SRAM cell, a layer which crosses the same boundary is continuously formed such that portions of the layer located in the two SRAM cells constitute an integral continuous layer. For example, as shown in FIG. 2, first semiconductor fins 310 each extends continuously between the first and second boundaries 301 and 302 and can further extend continuously to another SRAM cell (not shown) adjacent to the SRAM cell 10 in the Y axis. On the other hand, in a case in which a layer is spaced apart from one of boundaries of a cell, the layer is discontinuously formed in two immediately adjacent cells. In this FIG. 2 case, in an SRAM cell and another SRAM cell adjacent to the SRAM cell sharing the same boundary with the SRAM cell, the second gate electrode layer 420 is spaced apart from the fourth boundary 304 and is not directly coupled to a corresponding second gate electrode layer 420 formed in the other SRAM cell immediately adjacent thereto. In this case, the second gate electrode layers 420 of two immediately adjacent cells are spaced apart from each other.

As shown in FIG. 2, the SRAM cell 10 includes the first semiconductor fins 310, a second semiconductor fin 320, a third semiconductor fin 330, and fourth semiconductor fins 340 each extending along Y direction and sequentially arranged along the X axis. A semiconductor fin is a structure protruding from a substrate (not shown). Shallow trench isolation (STI) (not shown) can be formed over the substrate to surround the semiconductor fins so as to define the semiconductor fins. One or more fin field-effect transistors (fin FET) can be constructed based on the semiconductor fins.

Referring to FIG. 2, the first and fourth semiconductor fins 310 and 340 each extend continuously between the first and second boundaries 301 and 302, and are respectively formed in the first and second P-type wells Pwell located on opposite sides of the N-type well Nwell. The second semiconductor fin 320, formed within the N-type well Nwell, extends from the second boundary 302 toward the first boundary but is spaced apart from the first boundary 301. The third semiconductor fin 330, formed within the N-type well Nwell, extends from the first boundary 301 toward the second boundary 302 but is spaced apart from the second boundary 302.

Source, drain, and channel regions of the first pass-gate transistor PG1 and the first pull-down transistor PD1 of the SRAM cell 10 are made of the first semiconductor fins 310. Source, drain, and channel regions of the second pass-gate transistor PG2 and the second pull-down transistor PD2 are made of the fourth semiconductor fins 340. Source, drain, and channel regions of the first pull-up transistor PU1 of the SRAM cell 10 and source, drain, and channel regions of the second pull-up transistor PU2 of the SRAM cell 10 are made of the second and third semiconductor fins 320 and 330, respectively.

Referring to FIG. 2, the first semiconductor fins 310 and the fourth semiconductor fins 340 each include two parallel semiconductor fins to provide a larger driving current. In some embodiments, each of the first pass-gate transistor PG1, the first pull-down transistor PD1, the second pull-down transistor PD2, and the second pass-gate transistor PG2 is formed of a single semiconductor fin. In other embodiments, each of the first pass-gate transistor PG1, the first pull-down transistor PD1, the second pull-down transistor PD2, and the second pass-gate transistor PG2 is formed of more than two parallel connected sub-transistors, in which source, drain, and channel regions are arranged parallel to each other and a common gate electrode is formed over the more than two parallel channel regions.

As show in FIG. 2, the SRAM cell 10 includes first and second gate electrode layers 410 and 420 spaced-apart from each other and aligned in the X axis. The first gate electrode layer 410 is formed over the channel region of the first pass-gate transistor PG1, and the second gate electrode layer 420 is formed over the channel regions of the second pull-up transistor PU2 and the second pull-down transistor PD2. The SRAM cell 10 also includes a third gate electrode layer 430 covering the channel region of the second pass-gate transistor PG2 and a fourth gate electrode layer 440 covering the channel regions of the first pull-up transistor PU1 and the first pull-down transistor PD1. The third gate electrode layer 430 and the fourth gate electrode layer 440 are spaced-apart from each other and aligned to each other in the X axis.

The first pass-gate transistor PG1 and the first pull-down transistor PD1 of the SRAM cell 10 have the drain regions thereof directly coupled to each other by a central portion of the first semiconductor fins 310. The drain region of the first pull-up transistor PU1 is connected to the coupled drain regions of the first pass-gate transistor PG1 and the first pull-down transistor PD1 through a longer contact 710. The second pass-gate transistor PG2 and the second pull-down transistor PD2 of the SRAM cell 10 have the drain regions thereof directly coupled to each other by a central portion of the fourth semiconductor fins 340. The drain region of the second pull-up transistor PU2 is connected to the coupled drain regions of the second pass-gate transistor PG2 and the second pull-down transistor PD2 through a longer contact 720. A longer contact having a rectangular shape in the layout view may have a thickness greater than a gate contact (see Gate_CO in FIG. 5), such that the longer contact can connect source or drain region or a silicide layer over the source or drain region to via0 or can be electrically connected to a gate electrode layer through a gate contact formed thereon.

The longer contacts 710 and 720 are respectively electrically connected to the second and fourth gate electrode layers 420 and 440 through butt contacts 630 and 660 formed thereon. Thus, the drain regions of the first pass-gate transistor PG1, the first pull-down transistor PD1, and the first pull-up transistor PU1, and the second gate electrode layer 420 covering channels of the second pull-up transistor PU2 and the second pull-down transistor PD2 are electrically connected by the longer contact 710 and the butt contact 630. The longer contact 710 and the butt contact 630 act as the first local connection electrode ND11 shown in FIG. 1. The drain regions of the second pass-gate transistor PG2, the second pull-down transistor PD2, and the second pull-up transistor PU2, and the fourth gate electrode layer 440 covering channels of the first pull-up transistor PU1 and the first pull-down transistor PD1 are electrically connected by the longer contact 720 and the butt contact 660. The longer contact 720 and the butt contact 660 act as the second local connection electrode ND12 shown in FIG. 1.

The SRAM 10 further includes additional longer contacts including longer contacts 730, 740, 750, 760, 770, and 780. The longer contact 730 electrically contacts a portion of the first semiconductor fins 310 which forms the source region of the first pass-gate transistor PG1, such that the source region of the first pass-gate transistor PG1 can be electrically connected to the first bit line BL through the longer contact 730 and a via via0 formed thereon. The longer contact 740 electrically contacts a portion of the third semiconductor fin 330 which forms the source region of the second pull-up transistor PU2, such that the source region of the second pull-up transistor PU2 can be electrically connected to the power line Vdd through the longer contact 740 and a via via0 formed thereon. The longer contact 750 electrically contacts a portion of the fourth semiconductor fins 340 which forms the source region of the second pull-down transistor PD2. The longer contact 760 electrically contacts a portion of the fourth semiconductor fins 340 which forms the source region of the second pass-gate transistor PG2, such that the source region of the second pass-gate transistor PG2 can be electrically connected to the second bit line BLB through the longer contact 760 and a via via0 formed thereon. The longer contact 770 electrically contact a portion of the second semiconductor fin 320 which forms the source region of the first pull-up transistor PU1, such that the source region of the first pull-up transistor PU1 can be electrically connected to the power line Vdd through the longer contact 770 and a via via0 formed thereon. The longer contact 780 electrically contacts a portion of the first semiconductor fins 310 which forms the source region of the first pull-down transistor PD1.

The longer contacts 730, 740, and 750 are aligned to each other along the X axis and disposed over the first boundary 301, the longer contacts 760, 770, and 780 are aligned to each other along the X axis and disposed over the second boundary 302, and the longer contacts 710 and 720 are aligned to each other in the X axis and disposed in an intermediate region of the SRAM cell 10. The first and second gate electrode layers 410 and 420 are aligned to each other in the X axis and disposed in a region between the longer contacts 730, 740, and 750, and the longer contacts 710 and 720. The third and fourth gate electrode layers 430 and 440 are aligned to each other in the X axis and disposed in a region between the longer contacts 760, 770, and 780, and the longer contacts 710 and 720. That is, patterns of the gate electrode layers and patterns of the longer contacts are alternately arranged in the Y axis.

Still referring to FIG. 2, a first metal layer M1, which forms the power line Vdd, the first and second bit lines BL and BLB, can additionally form first and second word line contacts WC1 and WC2 which are respectfully electrically connected to the first and third gate electrode layers 410 and 430 through vias via0 formed thereon, and third and fourth word line contacts WC3 and WC4 which are respectfully electrically connected to the longer contacts 780 and 750 through vias via0 formed thereon. The word line contacts WC1 and WC2 can be electrically connected, through vias via1 above vias via0, to a word line WL formed of a second metal layer M2 above the first metal layer M1.

The second metal layer M2 also forms the first and second power lines Vss1 and Vss2 extending parallel to the word line WL. The first power line Vss1 is electrically connected to the longer contact 780 through a via via1 therebetween, such that the source region of the first pull-down transistor PD1 can be electrically connected to the first power line Vss1. The second power line Vss2 is electrically connected to the longer contact 750 through a via via1 therebetween, such that the source region of the second pull-down transistor PD2 can be electrically connected to the second power line Vss2.

Figure 3:
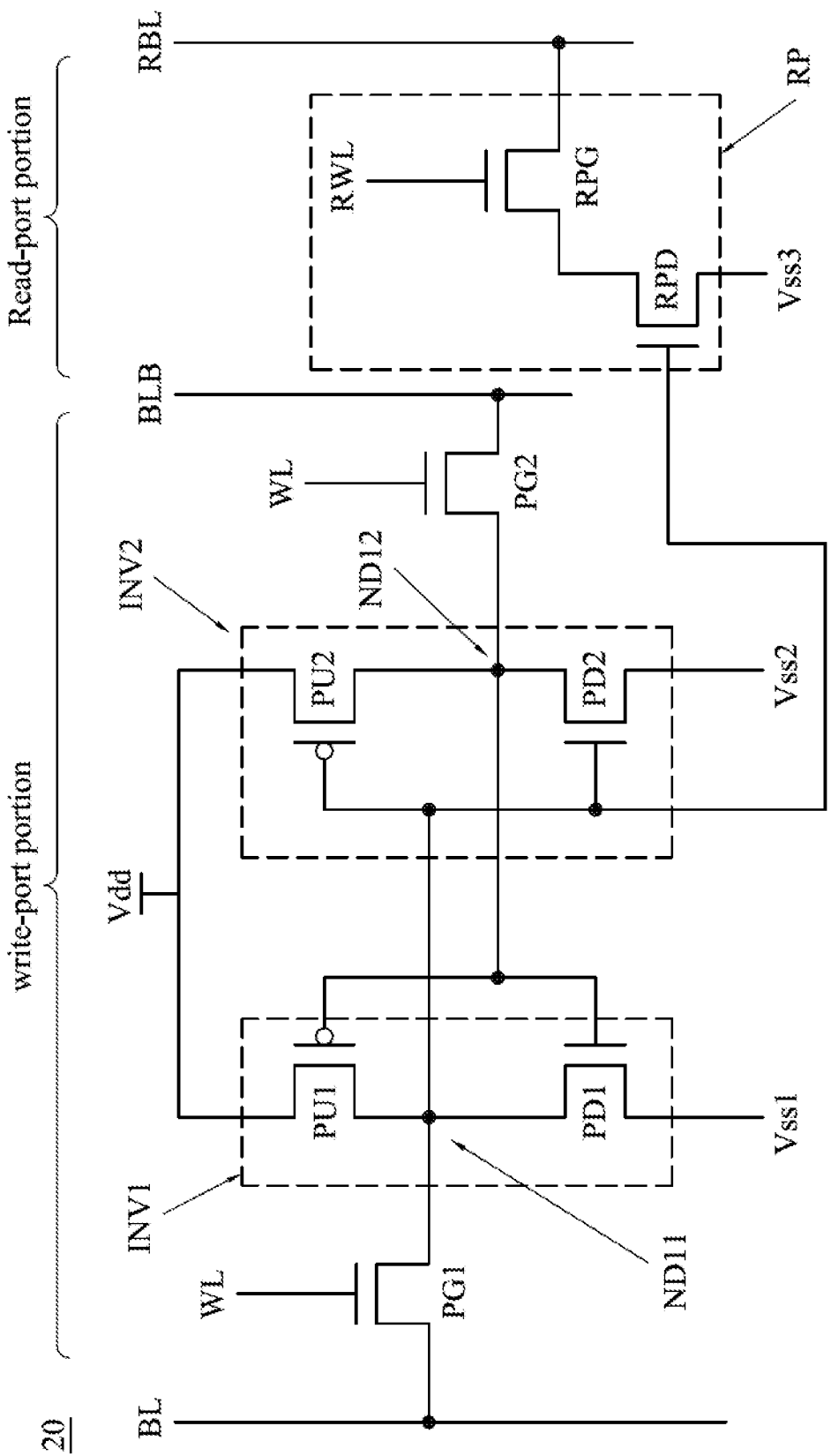
FIG. 3 illustrates an exemplary circuit diagram of another type of a static random access memory (SRAM) cell.
Figure 4:
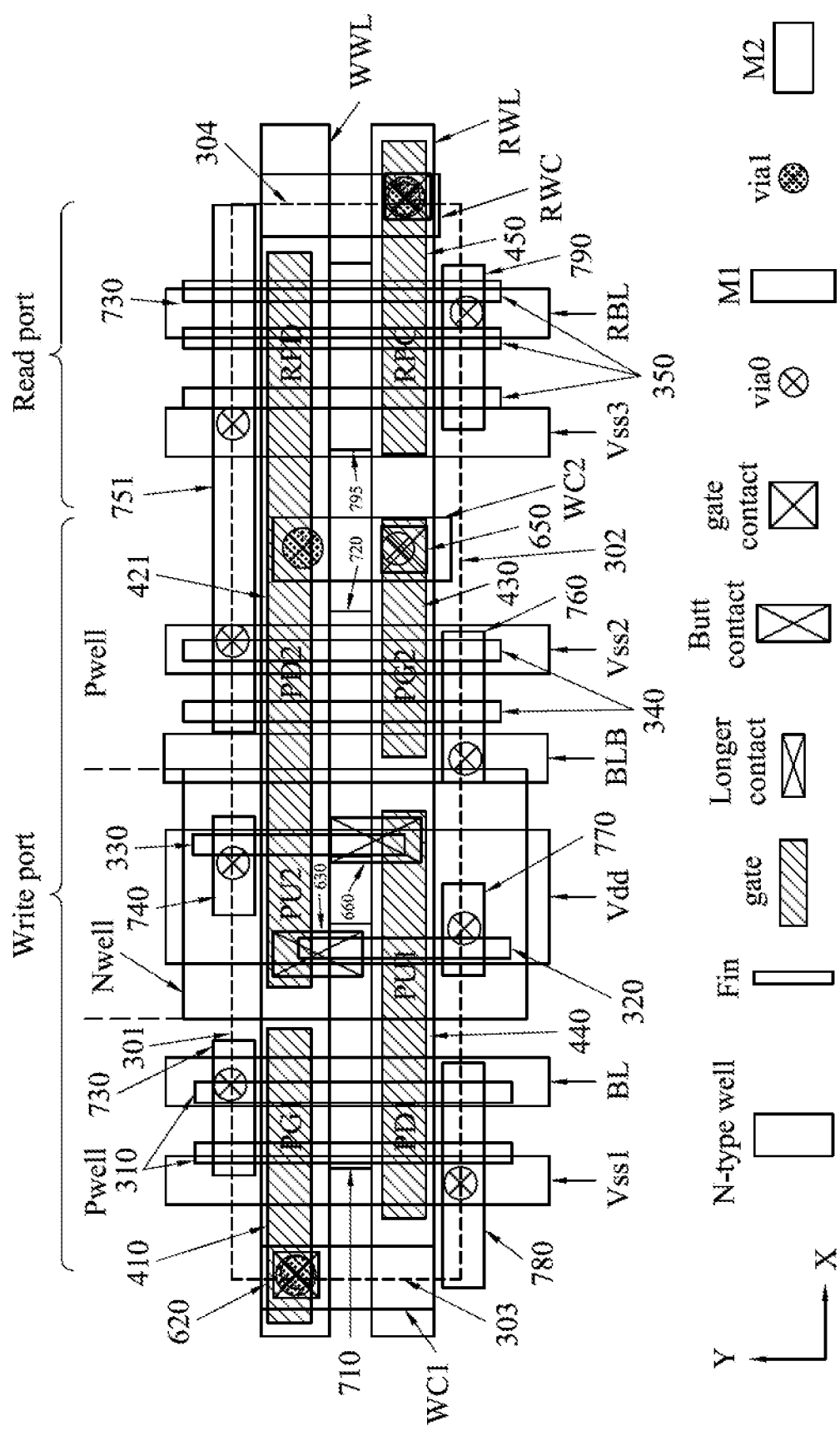
FIG. 4 illustrates an exemplary simplified layout of an SRAM cell, of which the circuit diagram is shown in FIG. 3.

FIG. 3 illustrates an exemplary circuit diagram of another static random access memory (SRAM) cell 20, and FIG. 4 illustrates an exemplary simplified layout of the SRAM cell 20.

The SRAM cell 20 includes a write-port portion including first and second pass-gate transistors PG1 and PG2, first and second pull-up transistors PU1 and PU2, and first and second pull-down transistors PD1 and PD2, and additionally includes a read-port portion including a read pass-gate transistor RPG and a read-pull-down transistor RPD.

The gate electrode layers of the second pull-up transistor PU2 and the second pull-down transistor PD2, the drain regions of the first pass-gate transistor PG1, the first pull-up transistor PU1, and the first pull-down transistor PD1, are electrically connected to a gate electrode of the read pull-down transistor RPD. A source region of the read pull-down transistor RPD is electrically connected to a third power line Vss3 and a drain region thereof is electrically connected to a drain region of the read pass-gate transistor RPG. A gate electrode of the read pass-gate transistor RPG is electrically connected to a read word line RWL and a source region thereof is electrically connected to a read bit line RBL.

Although the same reference characters are used to denote the signal/data/power lines electrically connected to terminals of the first and second pass-gate transistors PG1 and PG2 in FIGS. 1 and 3, one of ordinary skill in the art would understand that the word line WL in FIG. 3 can be a write word line for a writing operation such that data applied to the first and second bit line BL and BLB can be written to and stored by the SRAM cell 20. In such a configuration, the first and second bit lines BL and BLB can act as write bit lines. To avoid redundancy, only descriptions of the reference characters shown in FIGS. 3 and 4 different from or not shown in FIGS. 1 and 2 will be described in the following.

As shown in FIG. 4, the SRAM cell 20 further includes fifth semiconductor fins 350 formed in the P-type well Pwell in which the fourth semiconductor fins 340 are also formed. The second gate electrode layer 420 shown in FIG. 2 further extends in the X axis to cover the fifth semiconductor fins 350 and is denoted by reference character 421 in FIG. 4, such that the gate electrode layer 421 allows the gate electrodes of the second pull-up transistor PU2, the second pull-down transistor PD2, and the read pull-down transistor RPD to electrically connected to each other. The longer contact 750 shown in FIG. 2 further extends in the X axis to cover the fifth semiconductor fins 350 and is denoted by reference character 751 in FIG. 4, such that the longer contact 751 allows the source regions of the second pull-down transistor PD2 and the read pull-down transistor PRD to be electrically connected to each other.

As shown in FIG. 4, the SRAM cell 20 also includes a gate electrode layer 450 aligned to the third and fourth gate electrode layers 430 and 440 and covering the fifth semiconductor fins 350 to form the read pass-gate transistor RPG. A longer contact 790, aligned to the longer contacts 760, 770, and 780 in the X axis, electrically contacts a portion of the fifth semiconductor fins 350 which forms a source region of the read pass-gate transistor RPG. The SRAM cell 20 further includes a longer contact 795, aligned to the longer contacts 710 and 720, electrically contacts a portion of the fifth semiconductor fins 350 which acts as drain regions of the read pass-gate transistor RPG and the read pull-down transistor RPD.

Moreover, the SRAM cell 20 includes a read word line contact RWC formed of the first metal layer M1 and electrically connected to the gate electrode layer 450 through a gate contact and via0 therebetween. The SRAM cell 20 also includes the third power line Vss3 and the read bit line RBL formed of the first metal layer M1. The third power line Vss3 can be electrically connected to the source of the read pull-down transistor RPD through the longer contact 751 and via0 thereon, and the read bit line RBL can be electrically connected to the source of the read pass-gate transistor RPG through the longer contact 790 and via0 thereon.

The read word line contact RWC formed of the first metal layer M1 can be electrically connected to the read word line RWL formed of a second metal layer M2 above the first metal layer M1, through a via via1 therebetween. The second metal layer M2 also forms the write word line WWL extending parallel to the read word line RWL along the X axis. The write word line WWL is electrically connected to the word line contacts WC1 and WC2 through vias via1 therebetween.

Similar to the SRAM cell 10, in the SRAM cell 20, the longer contacts and the gate electrode layers are alternately arranged in the Y axis.

Figure 5:
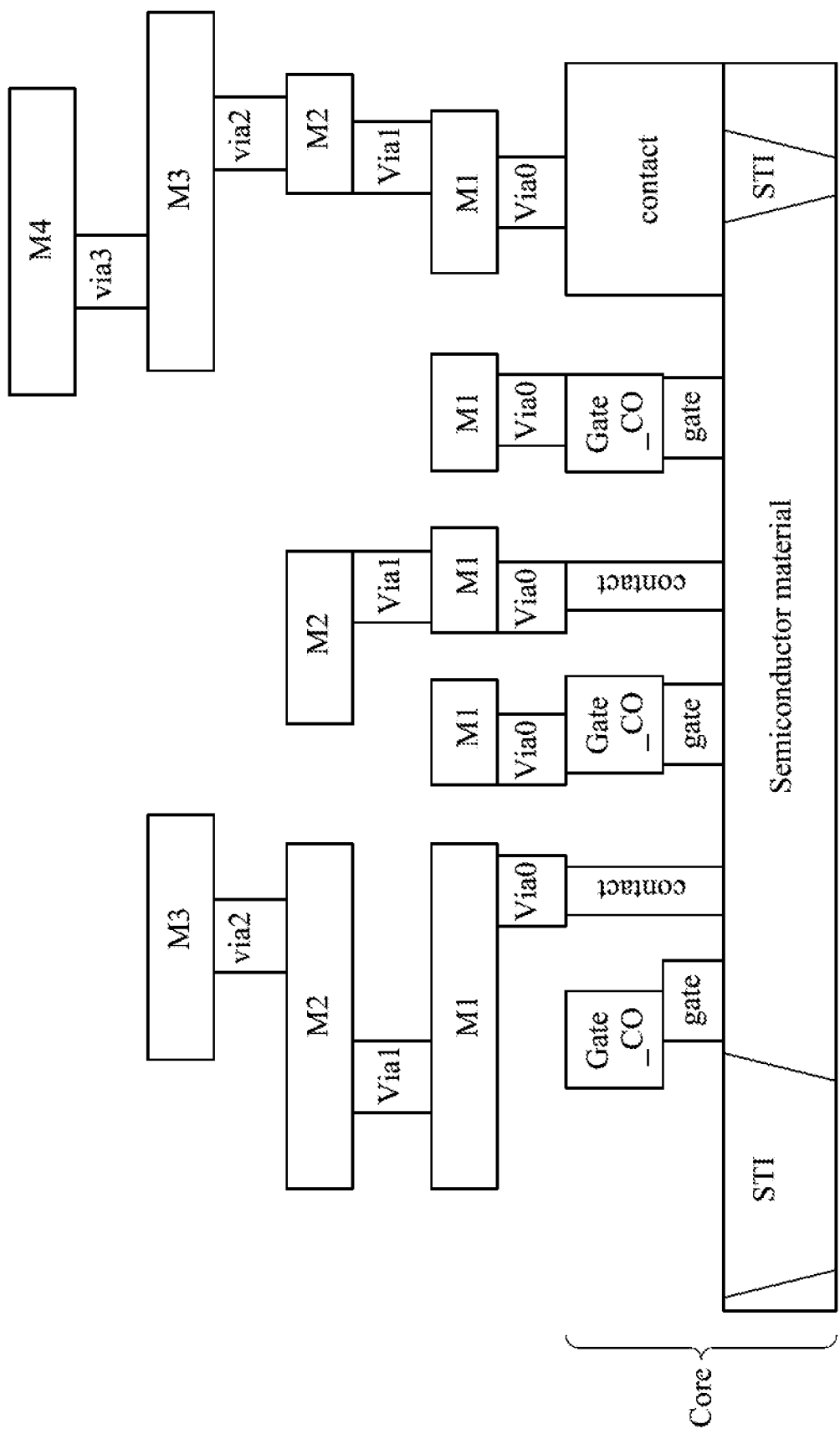
FIG. 5 shows an exemplary vertical configuration of an SRAM device.

FIG. 5 shows an exemplary vertical configuration of an SRAM device. The SRAM device can be implemented by a plurality of SRAM cells such as the aforementioned SRAM cells 10 and 20, and include a core structure, a first metal layer, one or more upper metal layers including one or more elements selected from the second through fourth metal layers, and vias including vias via0 and via1 and additional vias such as via2 and via3 depending on whether one or more upper metal layers are used to implement the SRAM device. The core structure includes an STI, a semiconductor material such as semiconductor fins, gate electrode layers (denoted by "gate" in FIG. 5), gate contacts Gate_CO, and longer contacts (denoted by "contact" in FIG. 5).

Although not described with reference to FIGS. 2 and 4, one or more metal layers selected from the second through fourth metal layers can be used to pattern the bit line, word line, read bit line, read word line, and power supply lines. In this case, a corresponding via (or vias) selected from via1, via2, and via3 can be used for vertically connected two immediately adjacent metal layers. The vias and metal layers are made of, but not limited to, one or more layers of Cu, W, Al, AlCu, TiN, TiW, Ti, Co, Ni, TaN, Ta, combination thereof, or the like.

Figure 6:
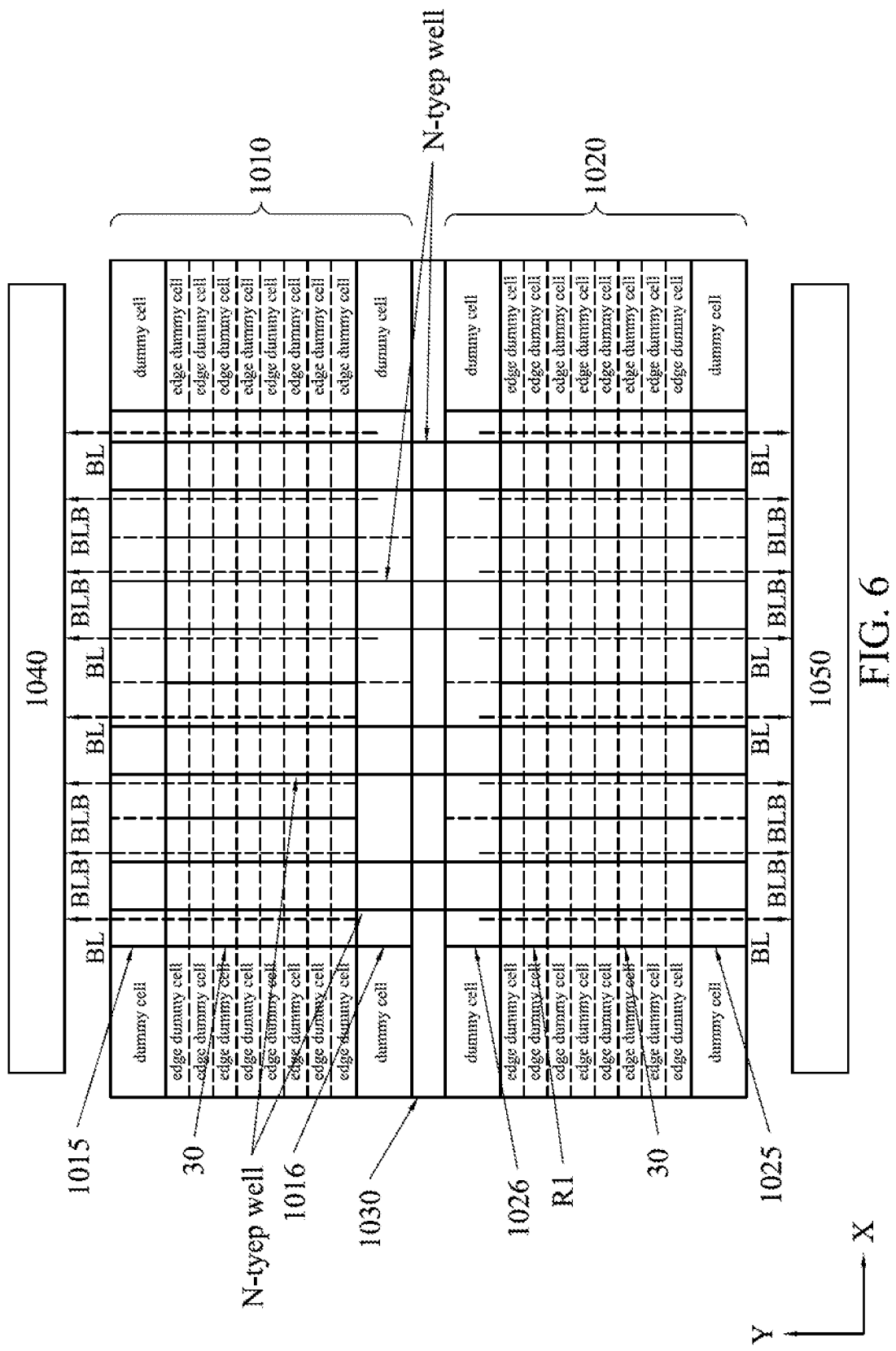
FIG. 6 shows a schematic layout of an SRAM device according to embodiments of the present disclosure.
Figure 7:
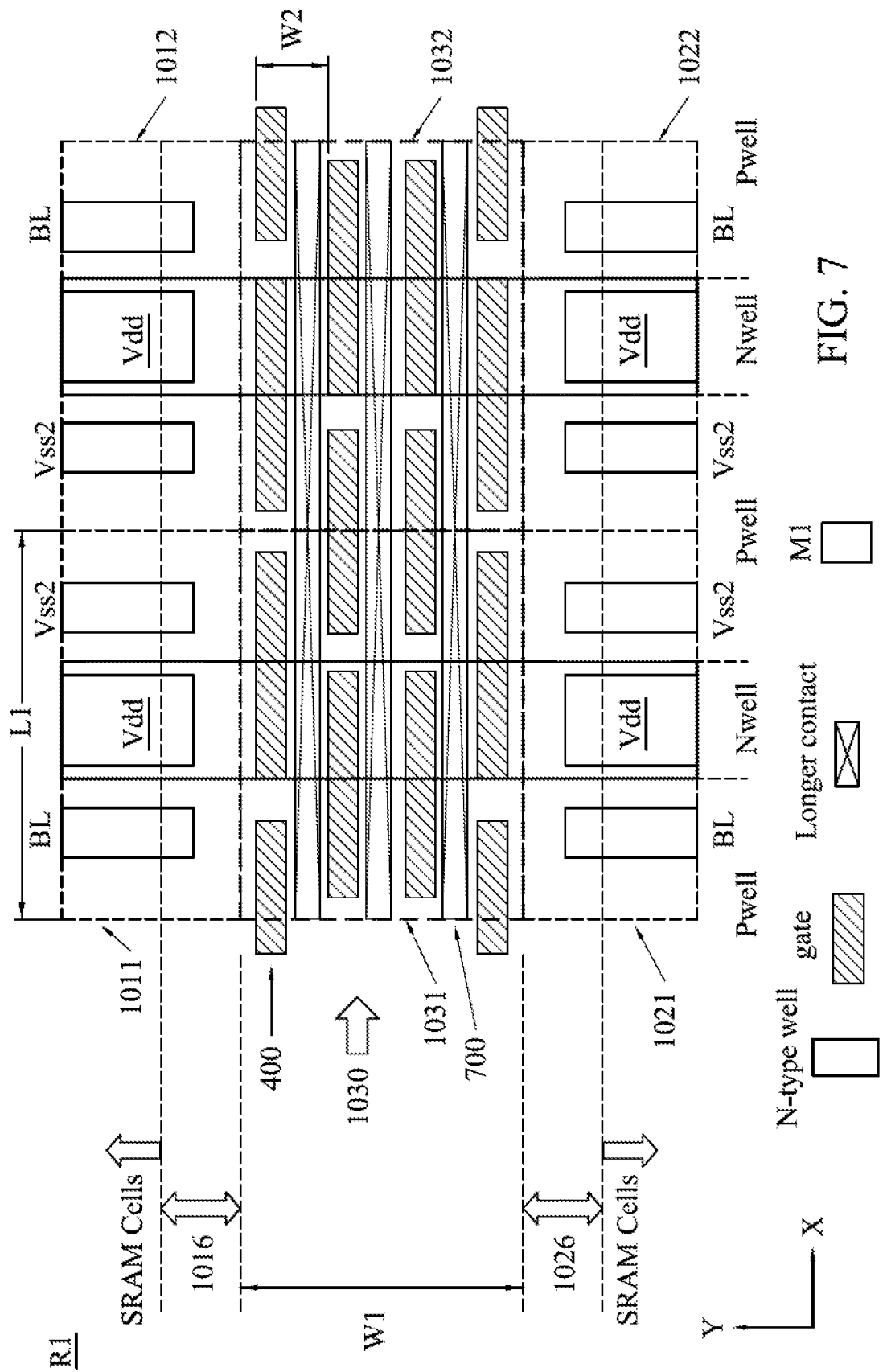
FIG. 7 shows an enlarged view of region R1 in FIG. 6.
Figure 8:
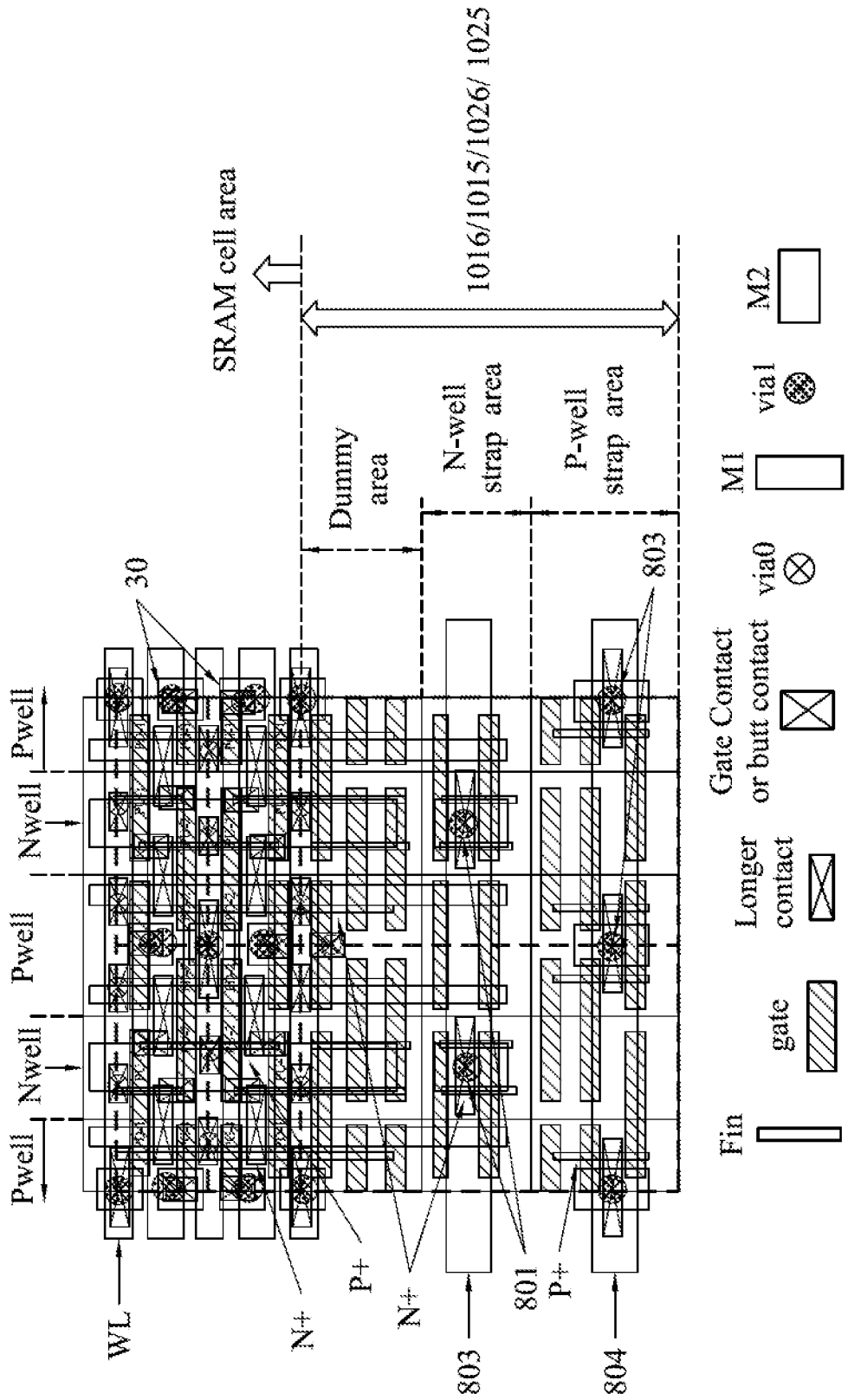
FIG. 8 shows exemplary N-type well strap cells and P-type well strap cells of an SRAM array.

FIG. 6 shows a schematic layout of an SRAM device according to embodiments of the present disclosure. FIG. 7 shows an enlarged view of region R1 in FIG. 6. FIG. 8 shows exemplary N-type well strap cells and P-type well strap cells of an SRAM array.

Referring to FIGS. 6 and 7, the SRAM device includes a first array region 1010 and a second array region 1020 spaced apart from each other by an abutting dummy cell region 1030. Each of the first and second array regions 1010 and 1020 includes a plurality of SRAM cells 30 which can be, for example, but not limited to, the aforementioned SRAM cells 10 or the aforementioned SRAM cells 20. The plurality of SRAM cells 30 are arranged in a matrix form. Any two immediately adjacent SRAM cells 30 sharing a common boundary are arranged line-symmetric to each other with respect to the common boundary therebetween.

Although the SRAM device shown in FIG. 6 only includes four columns of SRAM cells 30 and each of the first and second SRAM array regions 1010 and 1020 contains 8 rows of SRAM cells 30, the number of the columns and the number of the rows of each of the first and second SRAM array regions 1010 and 1020 should not be limited thereto.

Referring to FIGS. 6 and 7, the first SRAM array region 1010 includes first and second rows 1015 and 1016 of well strap cells disposed on opposite sides of the plurality of SRAM cells 30 of the first SRAM array region 1010. The second SRAM array 1020 includes third and fourth rows 1025 and 1026 of well strap cells disposed on opposite sides of the plurality of SRAM cells 30 of the second SRAM array region 1020. The second row 1016 of well strap cells of the first SRAM array region 1010 is disposed between the plurality of SRAM cells 30 in the first SRAM array region 1010 and the abutting dummy cell region 1030, and the fourth row 1026 of well strap cells of the second SRAM array region 1020 is disposed between the plurality of SRAM cells 30 in the second SRAM array region 1020 and the abutting dummy cell region 1030. A well strap cell has a function and a configuration to provide a fixed potential to the N-well well or the p-well well of the SRAM cell 30 from outside of the SRAM array.

As shown in FIGS. 6-8, each N-type well Nwell continuously extends from the SRAM cells 30 in the SRAM cell region 1010/1020 to one well strap cell of the first row 1015 and to one well strap cell of the third row 1025. Thus, in the same column, the N-type well continuously extends between two outmost well strap cells.

In some embodiments, the well strap cells of the first through fourth rows 1015, 1016, 1025, and 1026 can be the same type well strap cells including either N-type well strap cells or P-type well strap cells. In other embodiments, the well strap cells of the first and second rows 1015 and 1016 located in the same column can be different type well strap cells, and the well strap cells of the third and fourth rows 1025 and 1026 located in the same column can be different type well strap cells.

In some embodiments, each well strap cell in the first and third rows 1015 and 1025 is one of an N-type well strap cell and a P-type well strap cell, and each well strap cell in the second and fourth rows 1016 and 1026 is another of an N-type well strap cell and a P-type well strap cell.

In some embodiments, the well strap cells in the first and third rows 1015 and 1025 are P-type well strap cells and the well strap cells in the second and fourth rows 1016 and 1026 are P-type well strap cells.

In some embodiments, the P-well strap cell and the N-well strap cell are respectively formed in the P-well strap area and N-well strap area of each of the first to fourth rows 1015, 1016, 1025, and 10125, as shown in FIG. 8. An N-type well strap cell includes an N+ semiconductor material in the N-type well, such that the N+ semiconductor material allows the N-type well Nwell to be electrically connected to an N-well pickup metal line 803 to which Vdd can be applied during operation of the memory device. A P-type well strap cell includes a P+ semiconductor material in the P-type well, such that the P+ semiconductor material allows the P-type wells Pwell to be electrically connected to a P-well pickup metal line 804 to which Vss can be applied during operation of the memory device. In some embodiments, the N-well pickup metal line 803 and the P-well pickup metal line 804 are formed of the first metal layer M2 which is also used to form the word lines WL of the SRAM cells 30.

Referring to FIG. 7, the enlarged view of region R1 of FIG. 6 shows portions 1011 and 1021 which are portions of a first column of the first and second SRAM array regions 1010 and 1020 and portions 1012 and 1022 which are portions of a second column, immediately adjacent to the first column, of the first and second SRAM array regions 1010 and 1020. The abutting dummy cell region 1030 including one or more rows of abutting dummy cells is disposed in first and second columns of the first and second SRAM array regions 1010 and 1020. In a direction parallel to the Y axis and away from the abutting dummy cell region 1030, each of portions 1011, 1012, 1021, and 1022 can include at least well strap cells including the aforementioned N-type well strap cells or the aforementioned P-type well strap cells, and may include one or more SRAM cells 30 in a case in which the region R1 is defined to extend to the SRAM cells 30. An abutting dummy cell is a kind of a dummy cell which does not have any electrical function, and is inserted between two adjacent SRAM arrays in the Y axis. Thus, an abutting dummy cell is distinguishable from an edge dummy cell which is provided at an edge of the SRAM array immediately adjacent to the SRAM cells. The abutting dummy cell is provided adjacent to the well strap cell. A layout of an abutting dummy cell, a layout of a well strap cell, and a layout of an SRAM cell are different from each other. In some embodiments, structures formed of the same material at the same level in an abutting dummy cell, a well strap cell, and an SRAM cell have different shapes due to layouts thereof being different from each other, for example, by changing the relative sizes or the locations, or by not forming such a material on such a level in one of the abutting dummy cell, the well strap cell, and the SRAM cell while forming a structure based on such a material on such a level in another of the abutting dummy cell, the well strap cell, and the SRAM cell.

Layouts of abutting dummy cells 1031 and 1032 are configured to be the same as each other. The abutting dummy cells 1031 and 1032 include a plurality of dummy gate electrode layers 400 and a plurality of dummy longer contacts 700. A vertical configuration of the plurality of dummy gate electrode layers and the plurality of dummy longer contacts can be refer to the description of the gate electrode (gate) and longer contacts (contacts) with reference to FIG. 5, and therefore, the vertical configuration of the plurality of dummy gate electrode layers and the plurality of dummy longer contacts will be omitted here to avoid redundancy.

Referring to FIG. 7, each dummy contact 700 continuously extends along the X axis, and the dummy gate electrode layers 400 that are aligned to each other in the X axis are spaced-apart from each other.

The N-type well Nwell in each column of the plurality of SRAM cells 30 is continuously formed such that the N-type well Nwell extend across the first SRAM array region 1010, the second SRAM array region 1020, and the abutting dummy cells therebetween. Thus, in the same column, the N-type region in the abutting dummy cell, either the abutting dummy cell 1031 or the abutting dummy cell 1032, is physically connected to the N-type well formed in the first SRAM array region 1010 and the N-type well formed in the second SRAM array region 1020. In other words, one large continuous well is formed. One of ordinary skill in the art would appreciate that any regions in the first SRAM cell region 1010, the second SRAM region 1020, and the abutting dummy cell region 1030, not marked as the N-type well Nwell, are P-type wells Pwell.

In the abutting dummy cell region 1030, the dummy contacts 700 and the dummy gate electrode layers 400 are alternately disposed in the Y axis. For example, between any two immediately adjacent dummy contacts 700, a dummy gate electrode layer 400 is interposed, and between any two immediately adjacent dummy gate electrode layers 400, a dummy contact 700 is interposed, A length L1 of the abutting dummy cell 1031 or 1032 in the X axis is substantially the same as a length of the SRAM cell 30. A width W1 of the abutting dummy cell 1031 or 1032 in the Y axis is equal to or less than 2 times of a width of the SRAM cell 30. In a case in which, the width of the abutting dummy cell 1031 or 1032 in the Y axis is greater than 2 times of the width of the SRAM cell 30, a relatively large region is required for forming an abutting dummy cell and the use of the area for forming the SRAM device becomes less efficient. However, in other embodiments, the width of the abutting dummy cell 1031 or 1032 in the Y axis may be greater than 2 times of the width of the SRAM cell 30 so as to provide additional area in the abutting dummy cell 1031 or 1032 for extra metal routing.

According to some embodiments, the abutting dummy cells can be filled with materials for forming gate electrode layers to implement the aforementioned dummy gate electrode layers and materials for forming contact patterns to implement the aforementioned dummy contacts. That is, the dummy gate electrode layers in the abutting dummy cells and the gate electrode layers in each SRAM cell can be formed of the same material and be formed on the same level, and the dummy contacts in the abutting dummy cells and the contacts in each SRAM cell can be formed of the same material and be formed on the same level.

In some embodiments, the abutting dummy cells 1031 and 1032 can have a Y-pitch which is equal to the width W1, equal to or less than 6 times of a pitch W2 of dummy gate electrode layers 400 so as to reduce the size of the abutting dummy cells. In a case in which Y-pitch is more than 6 gate pitches, the size of the abutting dummy cells are relatively large. Here, a pitch is a distance in either the X direction or the Y direction by which two adjacent patterns/structures/cells are repeatedly disposed, with, or without, considering relative position differences in the Y direction or the X direction of the two adjacent patterns/structures/cells. In some embodiments, in the Y axis, a pitch of the gate electrode layers of the SRAM cell 30 can be the same as the pitch W2 of dummy gate electrode layers 400. In some embodiments, in the Y axis, a pitch of the longer contacts of the SRAM cell 30 can be the same as a pitch of the dummy contacts 700.

In some embodiments, materials such as dielectric materials including, but not limited to, silicon oxide, silicon nitride, or silicon oxynitride, can be used to fill space between adjacent dummy gate electrode layers 400 and dummy longer contacts 700 in the abutting dummy cells. Although not shown in FIG. 7, the abutting dummy cells 1031 and 1032 can include additional layers on the level above the dummy gate electrode layers 400 and the dummy longer contacts 700. Such additional layers can be the same as or different from those exemplary layers on the level above the dummy gate electrode 400 and the dummy longer contacts 700' shown in FIG. 9B or be the same as or different from those exemplary layers on the level above the dummy gate electrode 400 and the dummy longer contacts 700" shown in FIG. 10B.

By forming the abutting dummy cells between two adjacent SRAM array regions to replace a conventional relatively larger keep-out region in which no dummy contacts and/or no dummy gate electrode layers are formed between two adjacent SRAM arrays, the SRAM device according to some embodiments can have a smaller chip size spanned in the Y axis.

Now referring back to FIG. 6, the SRAM device further includes first and second peripheral circuits 1040 and 1050 respectively disposed on one side of the first and second SRAM array regions 1010 and 1020 such that the first and second bit lines BL and BLB are electrically connected thereto. Enabled by selection signals, the first and second peripheral circuits 1040 and 1050, together with operation of a word line driver (not shown), one or more SRAM cells 30 can be selected such that data stored thereof can be read out by the first and second peripheral circuits 1040 and 1050, and new data applied to the first and second bit lines BL and BLB can be written thereto. In Some embodiments, the first and second peripheral circuits 1040 and 1050 are a multiplexer and sensing amplifier of the SRAM device for selecting a corresponding bit line and read data stored in an SRAM cell 30. In some embodiments, additional abutting dummy cells (not shown) can be disposed between the first row 1015 of well strap cells and the first peripheral circuit 1040 and between the third row 1025 of the well strap cells and the second peripheral circuit 1050.

Since edge dummy cells are formed on opposite ends of any row of the plurality of SRAM cells 30 of the first and second SRAM arrays 1010 and 1020, no SRAM cell 30 is directly exposed to an edge of each of the first and second SRAM arrays 1010 and 1020, such that the plurality of SRAM cells 30 can have a more uniform operation regardless of the positions of the plurality of SRAM cells 30 in the SRAM array, as compared to an SRAM array without edge dummy cells.

Now referring to FIG. 8, the SRAM array further includes a dummy area between the N-well strap area and the SRAM cell area. The dummy area is an area, in which dummy cells having a layout different from a layout of an SRAM cell and a layout of an N-type or P-type well strap cell are formed. A dummy cell refers to a cell which is not configured to store data but can be configured to give a margin space or to provide extra space for vertical connections of a power line path, a bit line path, and/or a word line path for the SRAM array. The dummy cells can be configured similarly to edge dummy cells shown in FIG. 6. One of ordinary skill in the art should understand that "N+" and "P+" shown in FIG. 8 represent the doped impurities in the longer contacts thereof.

In some embodiments, two cells having the same layout indicates that, without rotating any of the two cells, or by rotating one of the two cells about 90°, about 180°, or about 270° with respect to a geometric center of boundaries of the one cell, or by flipping the layout of the one cell with respect to any one of the boundaries of the one cell, the two cells can have the same layout. In some embodiments, two cells having the same layout indicates that the two cells have the same structure with the same orientation, with, or without, consideration of process errors/variations occurred during manufacturing. In some embodiments, two cells having the same layout indicates that the two cells have the same structure but with different orientations, with, or without, consideration of process errors/variations occurred during manufacturing.

In some embodiments, edge dummy cells, N-type strap cells, P-type strap cells, and abutting dummy cells have layouts different from that of the SRAM cells. One of ordinary skill in the art should also understand that a layout of one of an edge dummy cell, an N-type strap cell, a P-type strap cell, and an abutting dummy cell and a layout of another one of an edge dummy cell, an N-type strap cell, a P-type strap cell, and an abutting dummy cell are different from each other in some embodiment. One of ordinary skill in the art should understand that if the same description is used to describe two cells, the two cells are designated to have the same layout in some embodiment. For example, two edge dummy cells have the same layout and two abutting dummy cells have the same layout, while an edge dummy cell and an abutting dummy cell have different layouts.

Figure 9A:
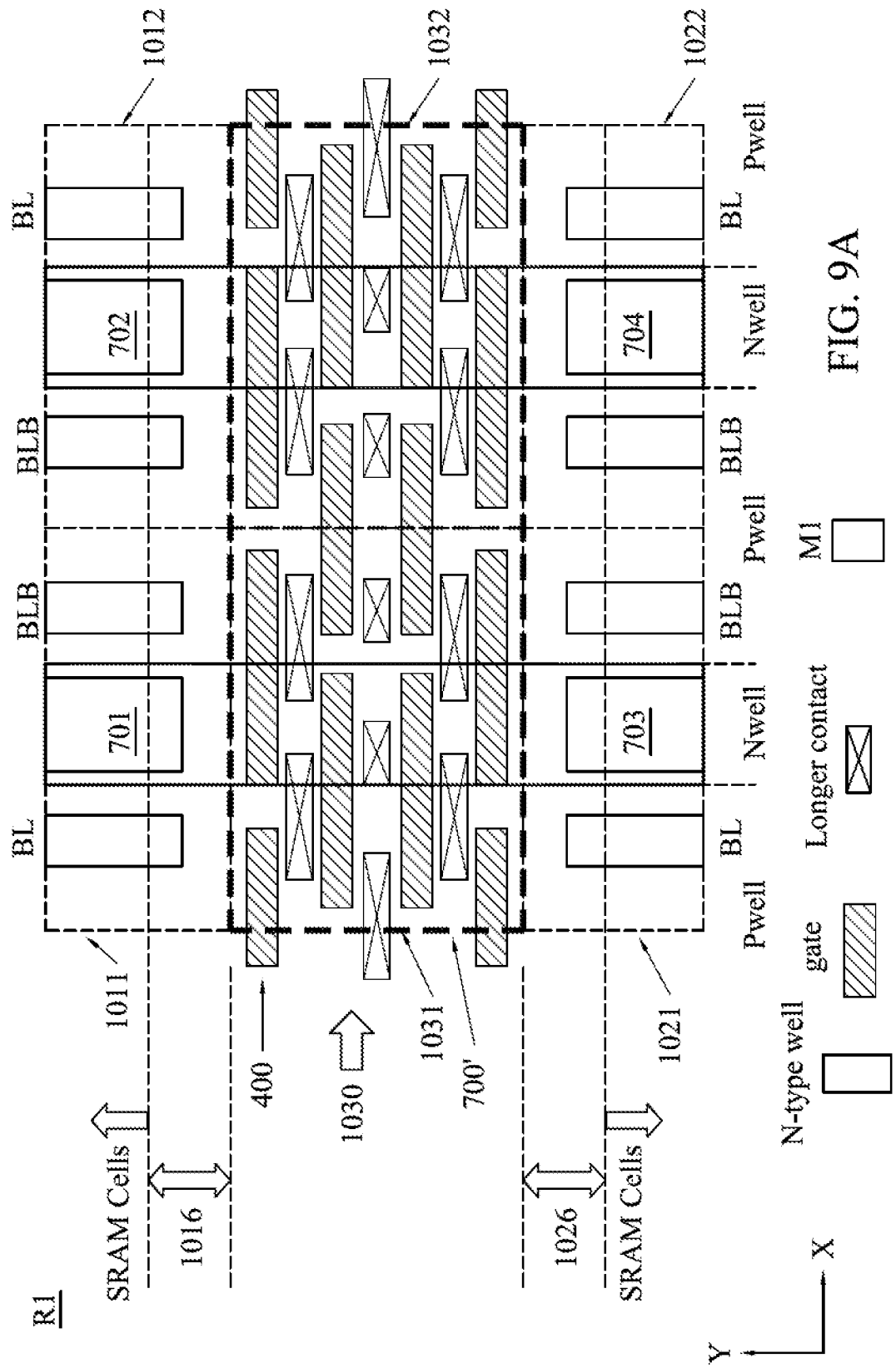
FIG. 9A shows another enlarged view of region R1.

FIG. 9A shows another enlarged view of region R1 in FIG. 6.

The region R1 shown in FIG. 9A is substantially the same as the region R1 shown in FIG. 7, except that each continuous dummy contact 700 is replaced by a plurality of continuous dummy contacts 700' aligned to each other in the X axis in the abutting dummy cells 1031 and 1032 in FIG. 9A. When each of the abutting dummy cells 1031 and 1032 is implemented to have dummy gate electrode layers and dummy contacts similar to or identical with the gate electrode layers and contacts of an SRAM cell, respectively, each of the abutting dummy cells 1031 and 1032 can provide similar or the same environment provided by an SRAM cell. Accordingly, the SRAM device according to embodiments shown in FIGS. 7 and 9A can have fewer issues during manufacturing by forming the abutting dummy cells 1031 and 1032, because on the level of gate electrode layer and the longer contact, the material compositions in the abutting dummy cells 1031 and 1032 and the SRAM cells 30 can have a relatively small variation so as to improve topography and reduce stress, as compared to an SRAM device that does not have dummy gate electrode layers or dummy contacts formed in a region between adjacent SRAM array regions.

According to some embodiments, although not shown, the dummy gate electrode layers 400 which are aligned to each other in the X axis and spaced-apart from each other can be replaced by a single continuous dummy gate electrode layer.

In some embodiments, although not shown in the drawings, at the level of the first metal layer M1, the second metal layer M2, and so on and the vias therebetween, only one or more dielectric materials fill the space between the first and second SRAM array regions 1010 and 1020. For example, the aforementioned metal layers and vias with reference to FIG. 5 are not contained in the abutting dummy cells 1031 and 1032 at the level of the first metal layer M1 and thereabove. In this case, each of the plurality of dummy gate electrode layers 400 and the plurality of dummy contacts 700' is a floating conductive element and is electrically isolated from any other metal or metal alloy used to form the first metal layer M1 and the other metal layers and vias above the first metal layer M1.

Figure 9B:
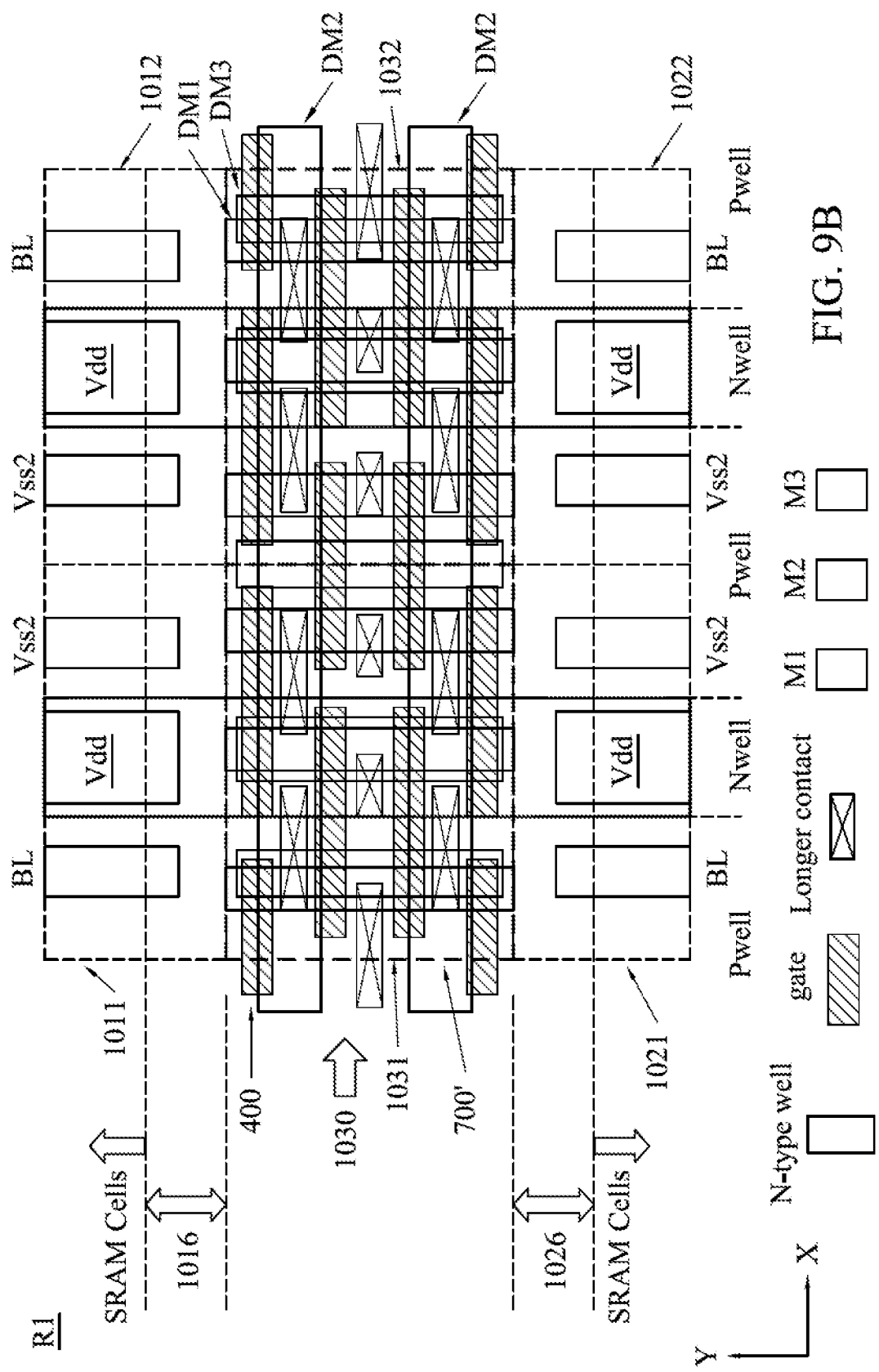
FIG. 9B shows the same layout as FIG. 9A except that first metal layer and thereabove are additionally illustrated.

The present disclosure is not limited to omitting the first metal layer M1, the second metal layer M2, and so on and the vias therebetween in the space between the first and second SRAM array regions 1010 and 1020. In other embodiments, as shown in FIG. 9B, at the level of the first metal layer M1, the second metal layer M2, and so on and the vias therebetween, the first metal layer M1, the second metal layer M2, and so on and the vias can be used to fill the space between the first and second SRAM array regions 1010 and 1020. Exemplary conductive patterns at the level of the first metal layer M1 and thereabove contained in the abutting dummy cells 1031 and 1032 can include dummy metal layers DM1 formed of the first metal layer M1 arranged parallel to each other along the Y axis, dummy metal layers DM2 formed of the second metal layer M2 arranged parallel to each other along the X axis, and/or dummy metal layers DM3 formed of the third metal layer M3 arranged parallel to each other along the Y axis.

In some embodiments, one or more of the vias visa0, via1, and/or via2 can be omitted, or included, in the abutting dummy cells 1031 and 1032. In some embodiments, each of the plurality of dummy gate electrode layers 400 and the plurality of dummy contacts 700' can be configured to be a floating conductive element and electrically isolated from any other metal or metal alloy used to form the first metal layer M1 and the other metal layers and vias above the first metal layer M1.

As shown in FIGS. 7, 9A, and 9B, in the abutting dummy cells 1031 and 1032, no semiconductor fin is formed; the present disclosure, however, is not limited thereto.

Figure 10A:
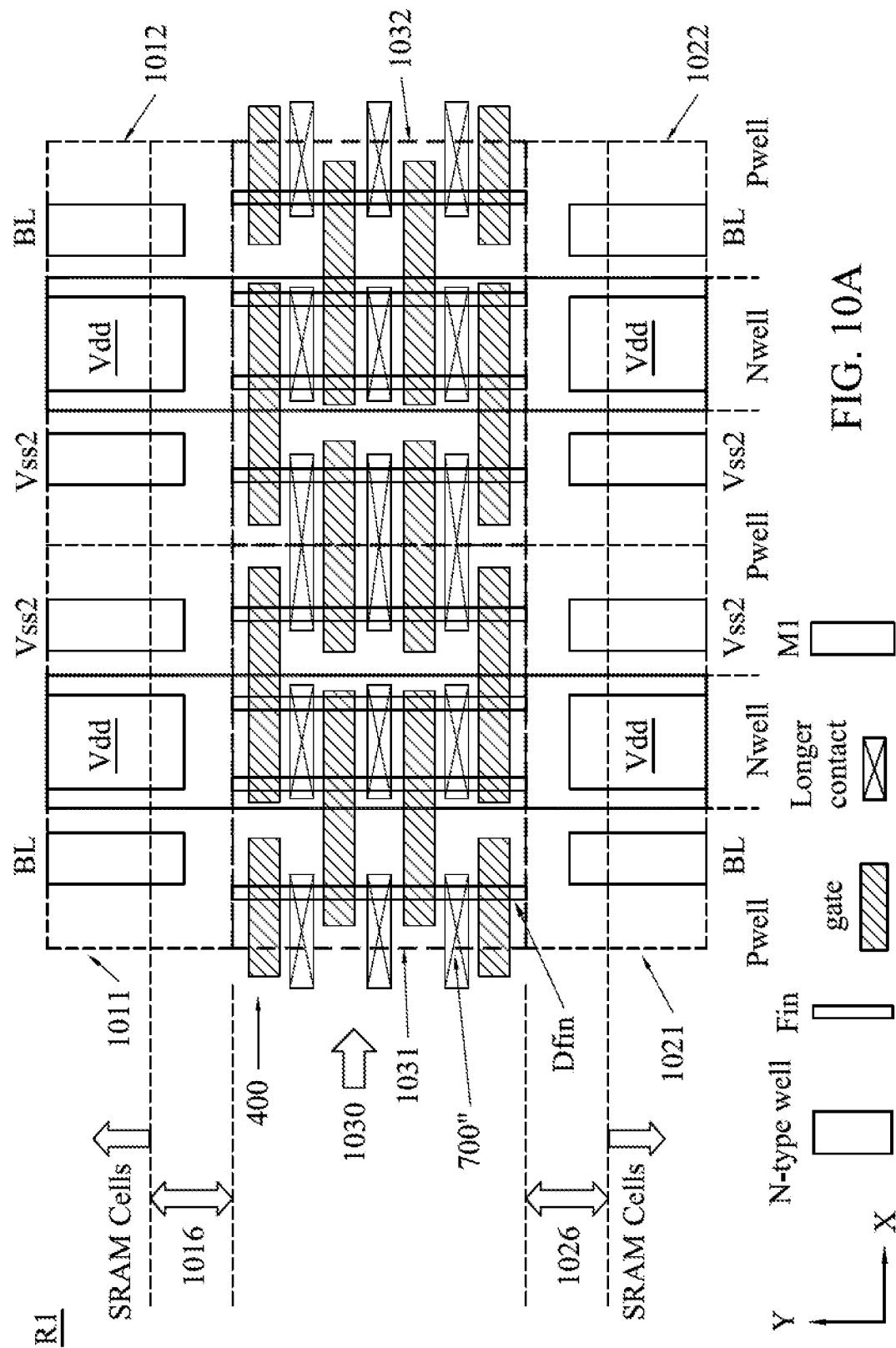
FIG. 10A shows another enlarged view of region R1.
Figure 10B:
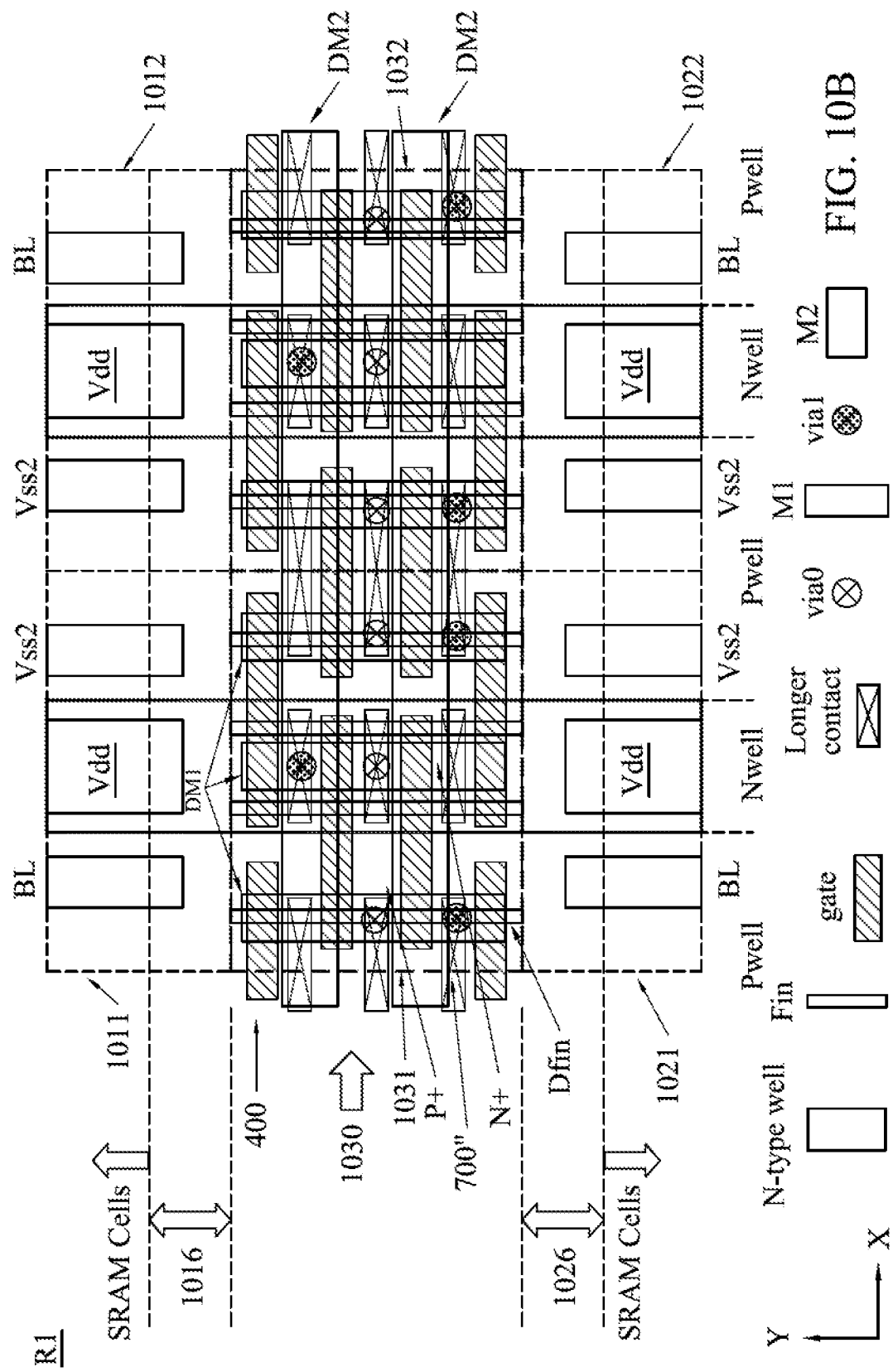
FIG. 10B shows the same layout as FIG. 10A except that first metal layer and thereabove are additionally illustrated.

FIGS. 10A and 10B show another enlarged view of region R1 in FIG. 6, according to some embodiments of the present disclosure.

As shown in FIGS. 10A and 10B, dummy semiconductor fins Dfin are formed in the abutting dummy cells 1031 and 1032. In some embodiments, the dummy semiconductor fins Dfins in each abutting dummy cell can have the same number as that in the SRAM cell 30. Although not shown, the dummy semiconductor fins Dfins can be aligned along the Y axis to the semiconductor fins in the SRAM cell 30. At least one of the layouts of the dummy gate electrodes 400, the dummy longer contacts 700", the dummy first metal layer Dm1, or the dummy second metal layer Dm2 in the abutting dummy cells 1031 and 1032 is different from a corresponding layout of the gate electrodes, the longer contacts, the first metal layer, and the second metal layer in the SRAM cell 30. Thus, even if the dummy semiconductor fins Dfin are formed by the same manufacturing process on the same level as the aforementioned semiconductor fins in the SRAM cell 30, the dummy semiconductor fins Dfin are not used to form semiconductor devices such as transistors corresponding to those in the SRAM cell 30. The present disclosure is not limited thereto. In other embodiments, the dummy semiconductor fins Dfins can be implemented to form transistors, which, however, are not configured to store data by changing or omitting metal wiring among the transistors.

According to one aspect of the present disclosure, by forming the aforementioned abutting dummy cells between adjacent SRAM array regions rather than forming a conventional keep-out region, the SRAM device can have a smaller chip size.

According to one aspect of the present disclosure, although no active transistors are formed in the abutting dummy cells, by forming dummy gate electrode layers and/or dummy contacts in the abutting dummy cells, the material compositions in the abutting dummy cells and the bit cells may have relatively a small variation such that the SRAM device can have an improved topographic and less stress, compared to an SRAM device that does not have dummy gate electrode layers or dummy contacts formed in a region between adjacent SRAM array regions.

According to one aspect of the present disclosure, a semiconductor device including a static random access memory (SRAM) device includes a first SRAM array including a first plurality of bit cells arranged in a matrix; a second SRAM array including a second plurality of bit cells arranged in a matrix; and a plurality of abutting dummy cells disposed between the first SRAM array and the second SRAM array. Each of the plurality of abutting dummy cells includes a plurality of dummy gate electrode layers and a plurality of dummy contacts. The semiconductor device further includes a first-type well continuously extending from the first SRAM array to the second SRAM array. The first-type well is in direct contact with portions of the plurality of dummy contacts.

According to one aspect of the present disclosure, a memory device includes first and second peripheral circuits, first array comprising a first plurality of bit cells and second array comprising a second plurality of bit cells disposed between the first and second peripheral circuits, wherein bit lines of the first plurality of bit cells are electrically connected to the first peripheral circuit and bit lines of the second plurality of bit cells are electrically connected to the second peripheral circuit, and a plurality of abutting dummy cells disposed between the first and second arrays. The plurality of abutting dummy cells include a plurality of dummy gate electrode layers, a plurality of dummy contacts, and a first-type well physically connected to a first-type well formed in the first array and a first-type well formed in the second array. The plurality of dummy gate electrode layers and gate electrodes of the first and second plurality of bit cells are formed of a same material. The plurality of dummy contacts and contacts of the first and second plurality of bit cells are formed of a same material.

According to one aspect of the present disclosure, a memory device includes a first plurality of bit cells continuously arranged in a column direction, and a second plurality of bit cells continuously arranged in the column direction and aligned to the first plurality of bit cells in the column direction. The first plurality of bit cells and the second plurality of bit cells are spaced apart from each other by an abutting dummy cell which includes one or more dummy gate electrode layers and one or more dummy contacts. The one or more dummy gate electrode layers and gate electrode layers in each bit cell are formed of a same material and are formed on a same level, and the one or more dummy contacts and contacts in each bit cell are formed of a same material and are formed on a same level. The memory device further includes a metal layer disposed on a level above the level of the dummy gate electrode layers. The metal layer is electrically connected to the gate electrode layers of each bit cell and electrically isolated from the one or more dummy gate electrode layers of the abutting dummy cell.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein.

Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device including a static random access memory (SRAM), comprising:
   a first SRAM array comprising a first plurality of bit cells arranged in a matrix;
   a second SRAM array comprising a second plurality of bit cells arranged in a matrix;
   a plurality of abutting dummy cells disposed between the first SRAM array and the second SRAM array,
   wherein:
   each of the plurality of abutting dummy cells comprises:
   a plurality of dummy gate electrode layers having a length extending along a first direction; and
   a plurality of dummy contacts having a length extending along the first direction parallel to the dummy gate electrode layers,
   wherein at least one of the plurality of dummy contacts extends, in the first direction, continuously across the plurality of abutting dummy cells; and
   a first-type well continuously extending from the first SRAM array to the second SRAM array.

2. The semiconductor device of claim 1, wherein:
   the first SRAM array and the second SRAM array are aligned to each other in a second direction perpendicular to the first direction, and
   in the plurality of abutting dummy cells, the plurality of dummy contacts and the plurality of dummy gate electrode layers are alternately disposed in the second direction.

3. The semiconductor device of claim 1, wherein two or more dummy contacts of the plurality of dummy contacts are aligned to each other in the first direction and are spaced-apart from each other.

4. The semiconductor device of claim 1, wherein two or more dummy gate electrode layers of the plurality of dummy gate electrode layers are aligned to each other in the first direction and are spaced-apart from each other.

5. The semiconductor device of claim 1, wherein:
   the first SRAM array further comprises a first plurality of edge dummy cells on opposite sides of the first plurality of bit cells, and first well strap cells for providing fixed potentials to the plurality of bit cells,
   the second SRAM array further comprises a second plurality of edge dummy cells on opposite sides of the second plurality of bit cells, and second well strap cells for providing the fixed potentials to the plurality of bit cells, and
   the plurality of abutting dummy cells are disposed between the first well strap cells and the second well strap cells.

6. The semiconductor device of claim 1, wherein:
   the first-type well is an N-type well, and
   the semiconductor device further comprises first and second P-type wells located on opposite sides of the first-type well.

7. The semiconductor device of claim 1, wherein a length of each abutting dummy cell in the first direction is substantially same as a length of one of the first and second pluralities of bit cells, and a width of each abutting dummy cell in a second direction perpendicular to the first direction is equal to or less than 2 times of a width of the one of the first and second pluralities of bit cells.

8. The semiconductor device of claim 1, wherein each bit cell includes a plurality of semiconductor fins and each of the abutting dummy cells do not include any semiconductor fins.

9. The semiconductor device of claim 1, further comprising a metal layer including a plurality of patterns disposed on a same level and made of a same material,
   wherein:
   a first group of patterns of the plurality of patterns of the metal layer are disposed in one of the bit cells and a second group of patterns of the plurality of patterns of the metal layer are disposed in one of the abutting dummy cells, and one or more of the first group of patterns are electrically connected to one of the gate electrode layers of the one bit cell, and any of the second group of patterns are electrically isolated from any of the dummy gate electrode layers of the one of the abutting dummy cells.

10. A memory device, comprising:
first and second peripheral circuits;
first array comprising a first plurality of bit cells and second array comprising a second plurality of bit cells disposed between the first and second peripheral circuits, wherein bit lines of the first plurality of bit cells are electrically connected to the first peripheral circuit and bit lines of the second plurality of bit cells are electrically connected to the second peripheral circuit; and
a plurality of abutting dummy cells disposed between the first and second arrays, wherein:
the plurality of abutting dummy cells comprise:
  a plurality of dummy gate electrode layers having a length extending in a first direction;
  a plurality of dummy contacts having a length extending in the first direction and parallel to the plurality of dummy gate electrode layers,
  wherein at least one of the plurality of dummy contacts extends, in the first direction, continuously across the plurality of abutting dummy cells;
  wherein a length of an abutting dummy cell in the first direction is equal to a length of a bit cell in the first direction, and
  a width of an abutting dummy cell in a second direction perpendicular to the first direction is equal to or less than two times a width of a bit cell in the second direction.

11. The memory device of claim 10, further comprising:
a first row of well strap cells disposed between the first peripheral circuit and the first array;
a second row of well strap cells disposed between the first array and the abutting dummy cells;
a third row of well strap cells disposed between the second array and the abutting dummy cells; and
a fourth row of well strap cells disposed between the second peripheral circuit and the second array.

12. The memory device of claim 11, wherein:
the well strap cells are N-type well strap cells or P-type well strap cells,
an N-type well strap cell includes a layout different from that of any bit cell and that of any abutting dummy cell and includes an N+ semiconductor material in an N-type well, the N+ semiconductor material being electrically connected to a first power line, and
a P-type well strap cell includes a layout different from that of any bit cell and that of any abutting dummy cell and includes a P+ semiconductor material in a region outside the N-type well, the P+ semiconductor material being electrically connected to a second power line electrically isolated from the first power line.

13. The memory device of claim 10, wherein one or more of the plurality of dummy gate electrode layers and the plurality of dummy contacts are electrically floating.

14. The memory device of claim 10, wherein:
in the plurality of abutting dummy cells, the plurality of dummy contacts and the plurality of dummy gate electrode layers are alternately disposed in the second direction.

15. A memory device, comprising:
a first plurality of bit cells continuously arranged in a column direction; and
a second plurality of bit cells continuously arranged in the column direction and aligned to the first plurality of bit cells in the column direction, wherein:
the first plurality of bit cells and the second plurality of bit cells are spaced apart from each other by an abutting dummy cell which includes one or more dummy gate electrode layers and one or more dummy contacts,
the dummy gate electrode layers and dummy contacts have lengths extending along a row direction,
the dummy gate electrode layers are spaced apart from each other and arranged along a plurality of dummy gate electrode lines extending along the row direction,
the dummy contacts are arranged along a plurality of dummy contact lines extending along the row direction,
at least one of the dummy contacts extends, in the row direction, continuously across the dummy cell,
the dummy gate electrode lines and dummy contact lines are alternately arranged along the column direction perpendicular to the row direction, and
the abutting dummy cell has a width along the column direction equal to or less than six times a pitch of the dummy gate electrode layers along the column direction.

16. The memory device of claim 15, wherein each dummy contact contacts opposite edges of adjacent abutting dummy cells in a direction perpendicular to the column direction.

17. The memory device of claim 15, wherein one or more of the plurality of dummy gate electrode layers and the plurality of dummy contacts are electrically floating.

18. The memory device of claim 15, further comprising an N-type well extending from the first plurality of bit cells to the second plurality of bit cells.

19. The memory device of claim 18, further comprising first and second P-type wells located on opposite sides of the N-type well.

20. The memory device of claim 15, further comprising a first plurality of edge dummy cells on opposite sides of the first plurality of bit cells, and first well strap cells for providing fixed potentials to the plurality of bit cells.

* * * * *